(12) United States Patent
Kim et al.

(10) Patent No.: US 12,456,713 B2
(45) Date of Patent: Oct. 28, 2025

(54) DISPLAY APPARATUS USING SEMICONDUCTOR LIGHT-EMITTING DEVICE

(71) Applicant: LG ELECTRONICS INC., Seoul (KR)

(72) Inventors: Soohyun Kim, Seoul (KR); Sungyun Park, Seoul (KR); Indo Chung, Seoul (KR); Jeonghyo Kwon, Seoul (KR)

(73) Assignee: LG ELECTRONICS INC., Seoul (KR)

(*) Notice: Subject to any disclaimer, the term of this patent is extended or adjusted under 35 U.S.C. 154(b) by 632 days.

(21) Appl. No.: 17/794,395

(22) PCT Filed: Feb. 12, 2020

(86) PCT No.: PCT/KR2020/001937
§ 371 (c)(1),
(2) Date: Jul. 21, 2022

(87) PCT Pub. No.: WO2021/149861
PCT Pub. Date: Jul. 29, 2021

(65) Prior Publication Data
US 2023/0049446 A1 Feb. 16, 2023

(30) Foreign Application Priority Data
Jan. 22, 2020 (KR) .................. 10-2020-0008867

(51) Int. Cl.
*H01L 25/075* (2006.01)
*H10H 20/01* (2025.01)
*H10H 20/857* (2025.01)

(52) U.S. Cl.
CPC ....... *H01L 25/0753* (2013.01); *H10H 20/857* (2025.01); *H10H 20/018* (2025.01)

(58) Field of Classification Search
CPC ...... H01L 2224/95101; H01L 25/0753; H10D 30/0295; H10D 8/043; H10D 84/8316; H10H 20/018; H10H 20/857
See application file for complete search history.

(56) References Cited

U.S. PATENT DOCUMENTS 9,825,202 B2    11/2017  Schule et al.
2019/0245126 A1*  8/2019  Lim ..................... G09G 3/32
(Continued)

FOREIGN PATENT DOCUMENTS

EP    4068354       10/2022
JP    2017-135253    8/2017
(Continued)

OTHER PUBLICATIONS

PCT International Application No. PCT/KR2020/001937, International Search Report dated Oct. 14, 2020, 5 pages.
(Continued)

*Primary Examiner* — Matthew C Landau
*Assistant Examiner* — Dmitriy Yemelyanov
(74) *Attorney, Agent, or Firm* — LEE, HONG, DEGERMAN, KANG & WAIMEY

(57) ABSTRACT

The present invention relates to a display apparatus, specifically to a display apparatus using semiconductor light-emitting elements of a few micrometers to tens of micrometers in size. The present invention provides a display apparatus comprising: a base part; a partition part having a plurality of grooves; a plurality of semiconductor light-emitting elements arranged on the base part and mounted in the plurality of grooves; first and second wiring electrodes arranged on one side and the other side of each of the semiconductor light-emitting elements, respectively; an assembly electrode arranged on the base part and arranged on the one side of each of the semiconductor light-emitting (Continued)

elements; and a dielectric layer arranged on the base part and arranged between the assembly electrode and the first wiring electrode, wherein each of the plurality of grooves includes at least one recess portion formed in the horizontal direction with respect to the base part.

10 Claims, 13 Drawing Sheets

(56) References Cited

U.S. PATENT DOCUMENTS

| | | | |
|---|---|---|---|
| 2019/0326348 A1* | 10/2019 | Im | G09G 3/32 |
| 2022/0230997 A1 | 7/2022 | Choi | |
| 2022/0254961 A1 | 8/2022 | Chang et al. | |
| 2022/0367421 A1 | 11/2022 | Ko et al. | |
| 2022/0375915 A1 | 11/2022 | Kim et al. | |
| 2023/0005887 A1 | 1/2023 | Kwon et al. | |
| 2023/0059135 A1 | 2/2023 | Chang et al. | |

FOREIGN PATENT DOCUMENTS

| | | | |
|---|---|---|---|
| KR | 20190122117 A | * | 8/2018 |
| KR | 10-2019-0026617 | | 3/2019 |
| KR | 10-2019-0075869 | | 7/2019 |
| KR | 10-2019-0076929 | | 7/2019 |
| KR | 10-2019-0085892 | | 7/2019 |
| KR | 10-2019-0092330 | | 8/2019 |
| KR | 10-2019-0104277 | | 9/2019 |
| KR | 10-2019-0126260 | | 11/2019 |
| KR | 10-2019-0127418 | | 11/2019 |
| KR | 10-2019-0143840 | | 12/2019 |
| KR | 10-2020-0004936 | | 1/2020 |

OTHER PUBLICATIONS

Korean Intellectual Property Office Application No. 10-2020-0008867, Office Action dated Jun. 19, 2024, 4 pages.
European Patent Office Application Serial No. 20915582.9, Search Report dated Feb. 9, 2024, 13 pages.
Korean Intellectual Property Office Application No. 10-2020-0008867, Office Action dated Apr. 9, 2025, 7 pages.

* cited by examiner

[FIG. 1]
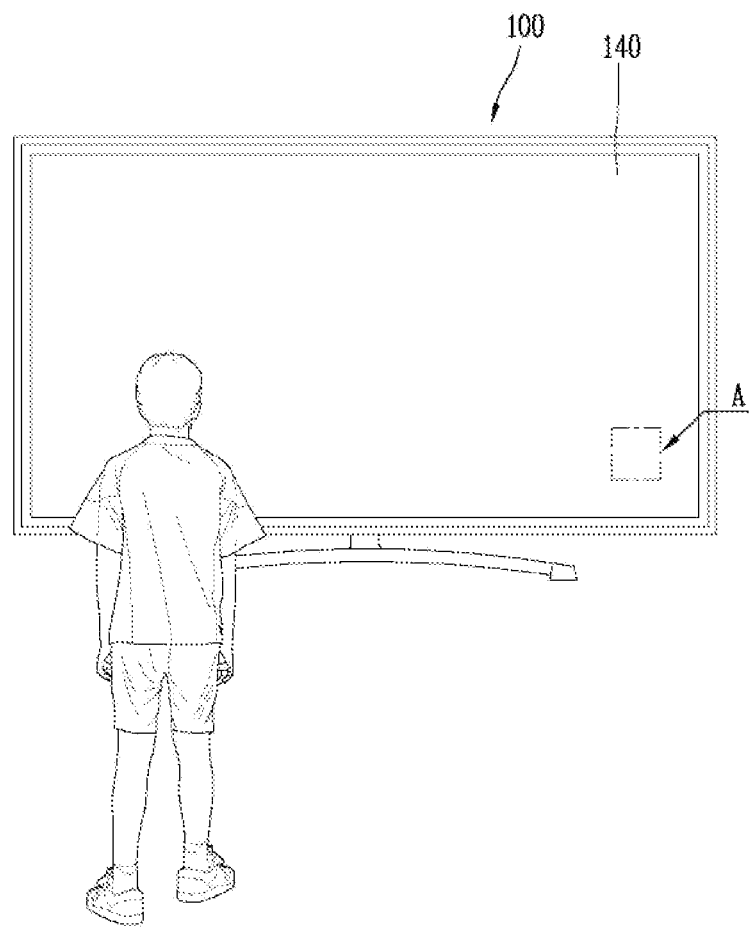

[FIG. 2]
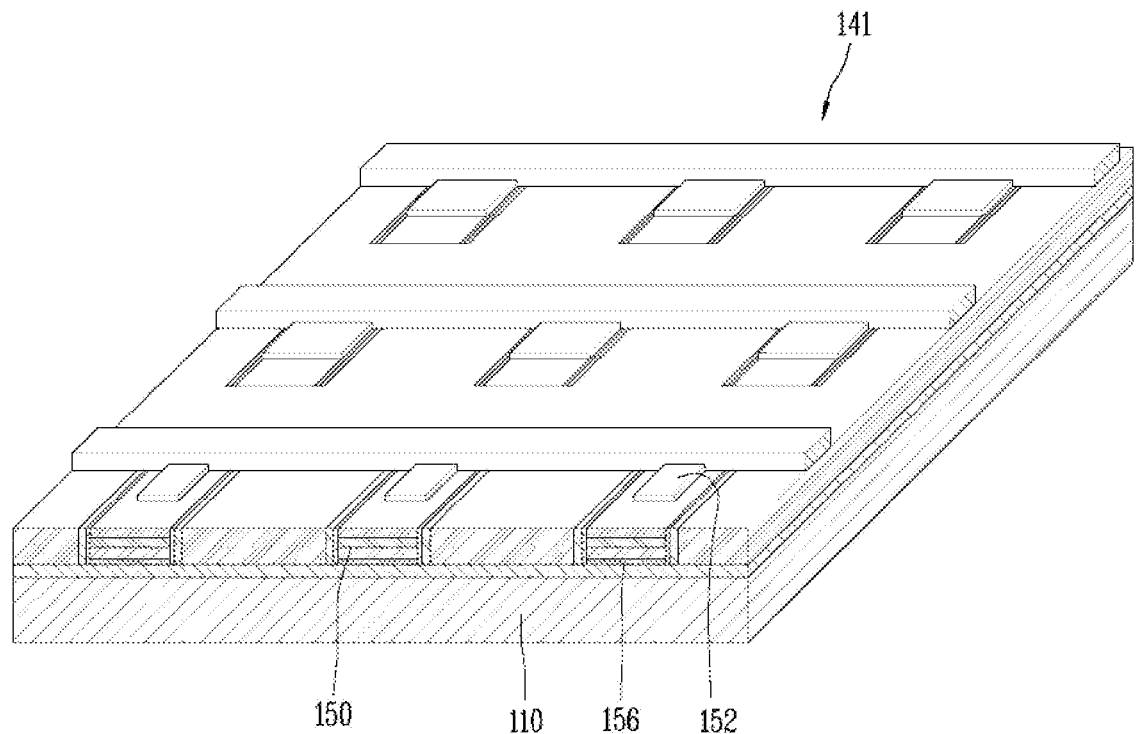
[FIG. 3]
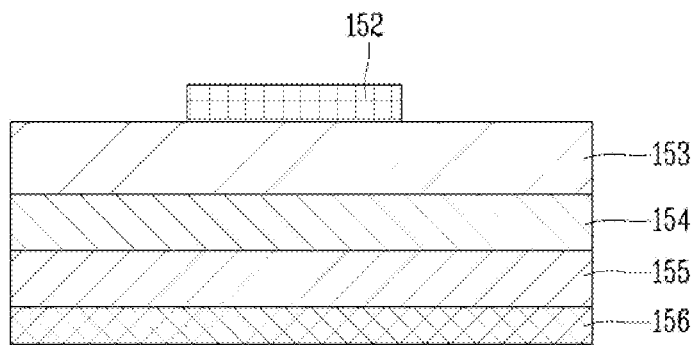

[FIG. 4]
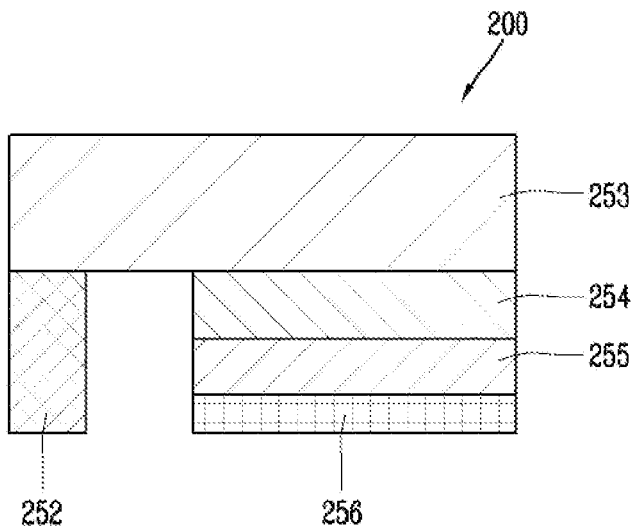
[FIG. 5a]
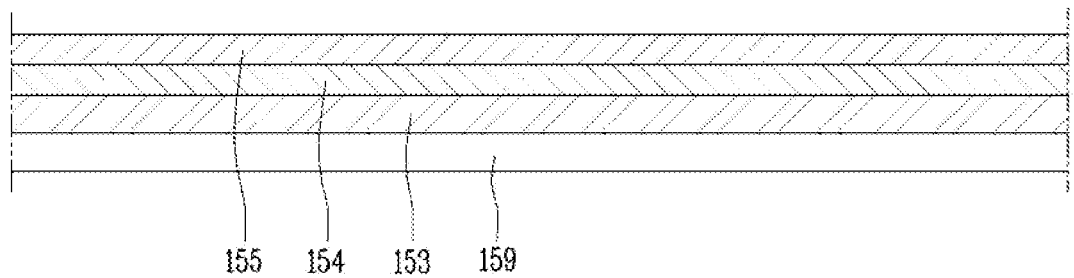
[FIG. 5b]
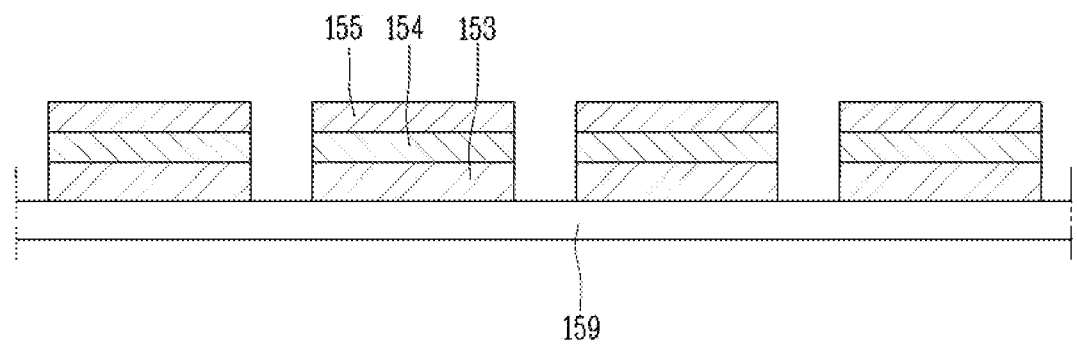

[FIG. 5c]
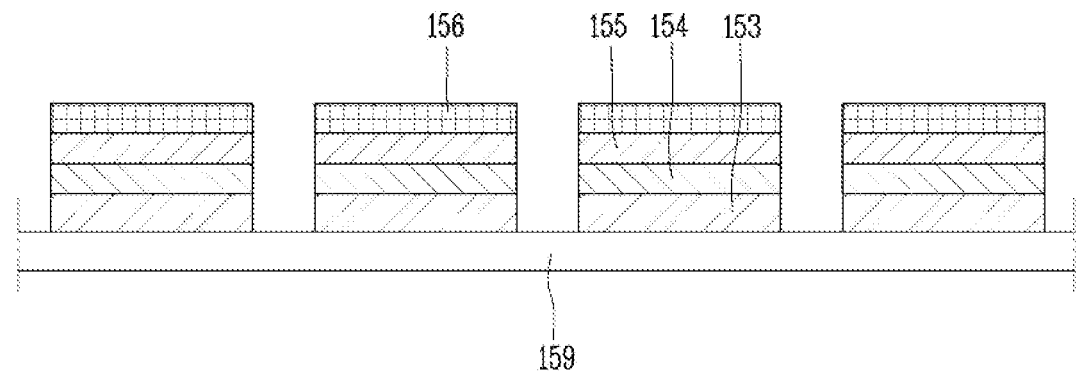
[FIG. 5d]
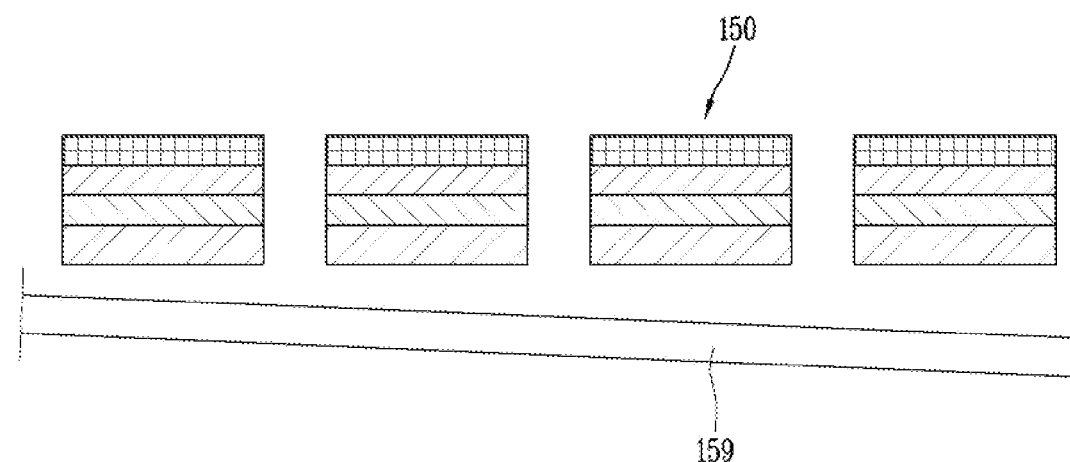
[FIG. 5e]
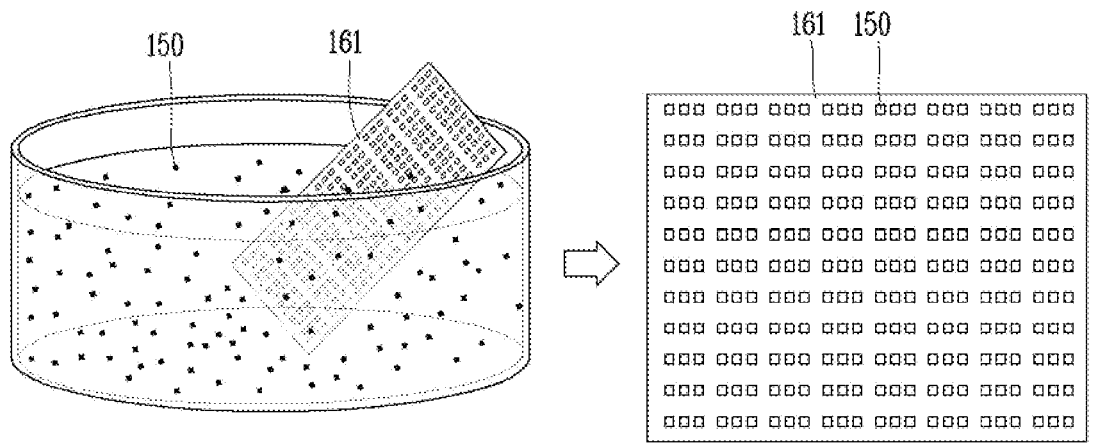

[FIG. 6]
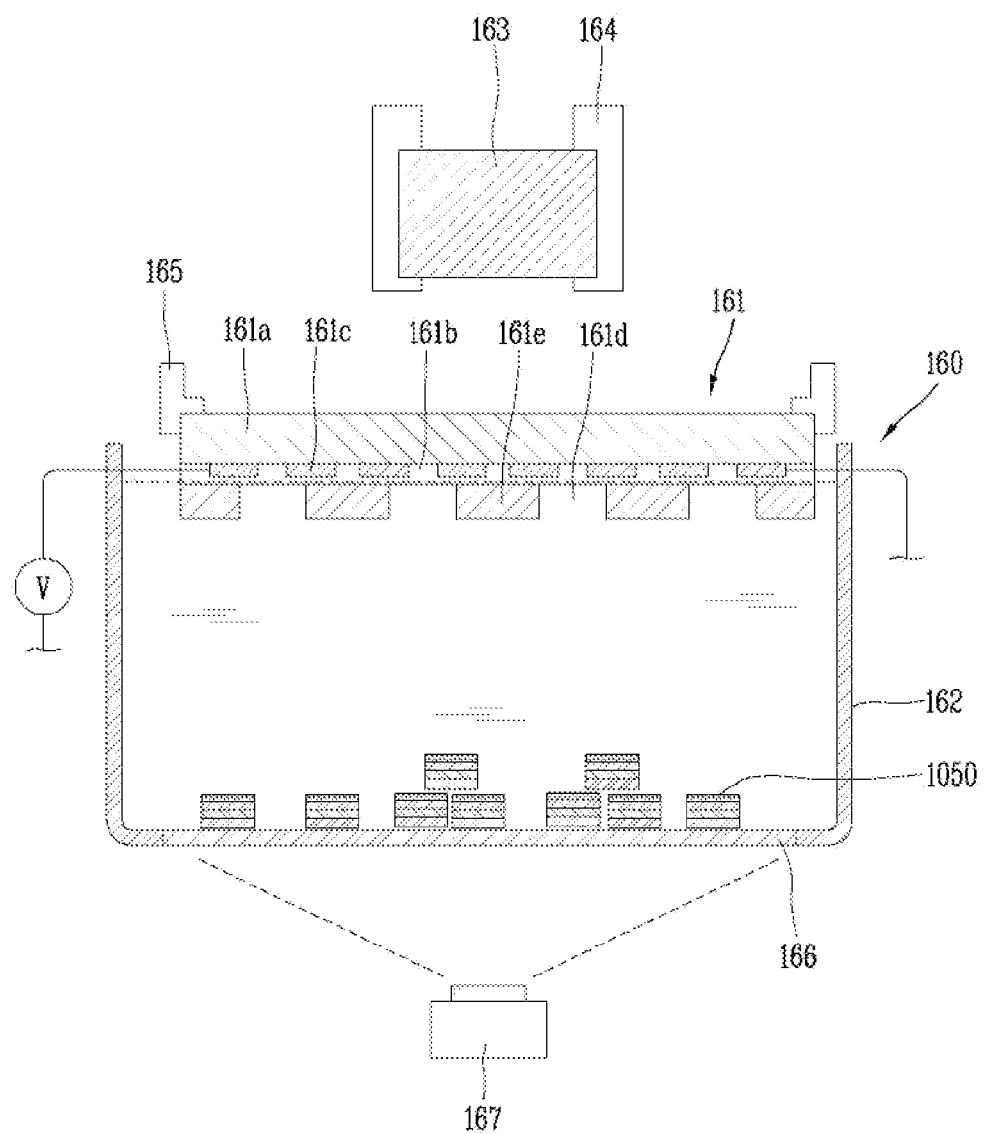

[FIG. 7]
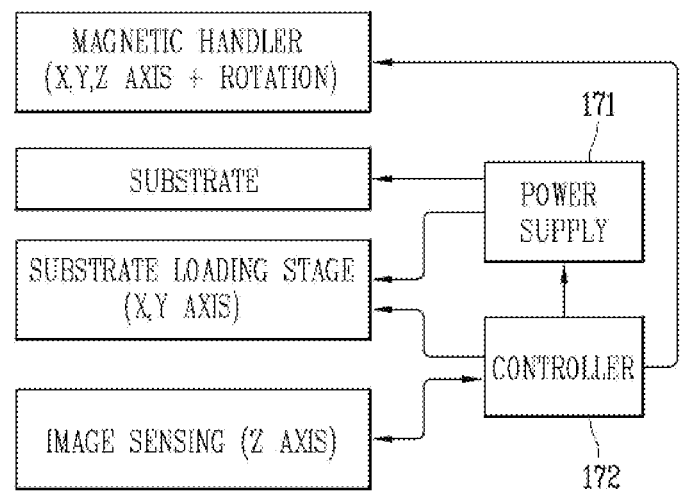

[FIG. 8a]
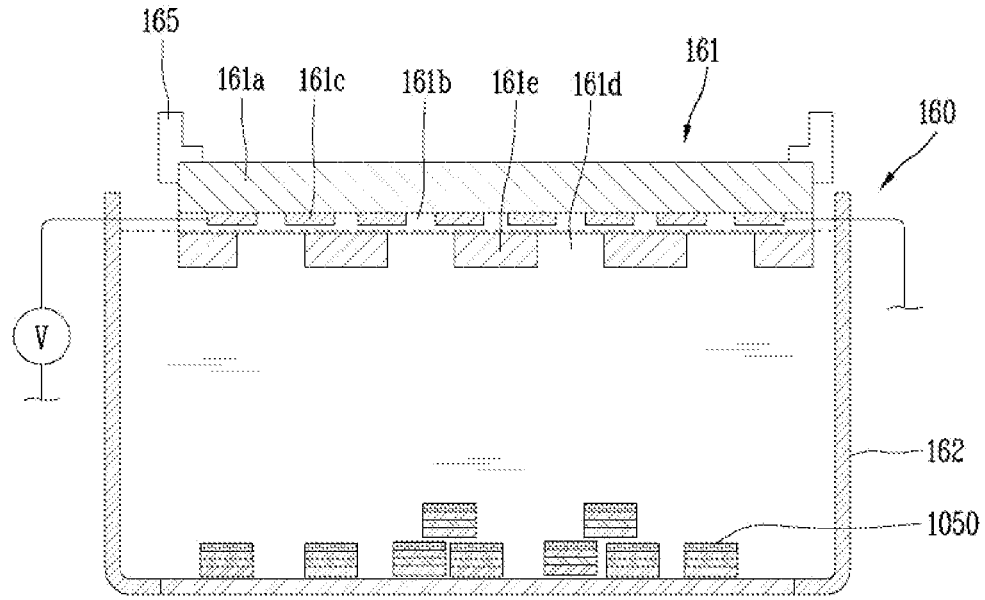
[FIG. 8b]
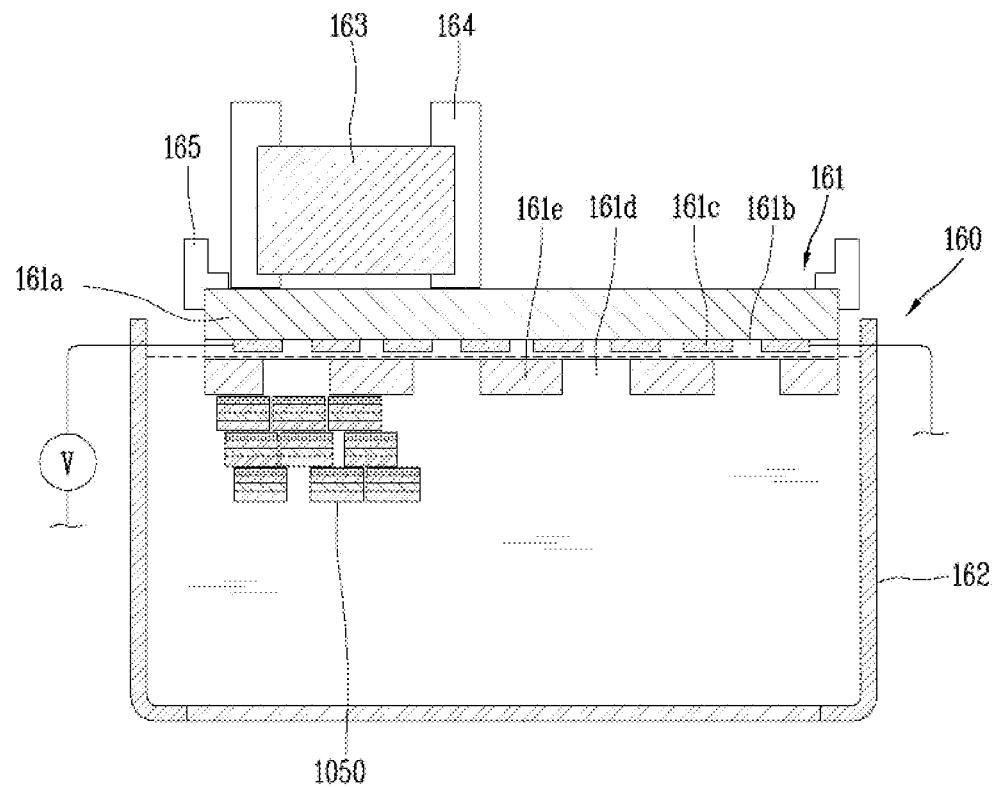

[FIG. 8c]
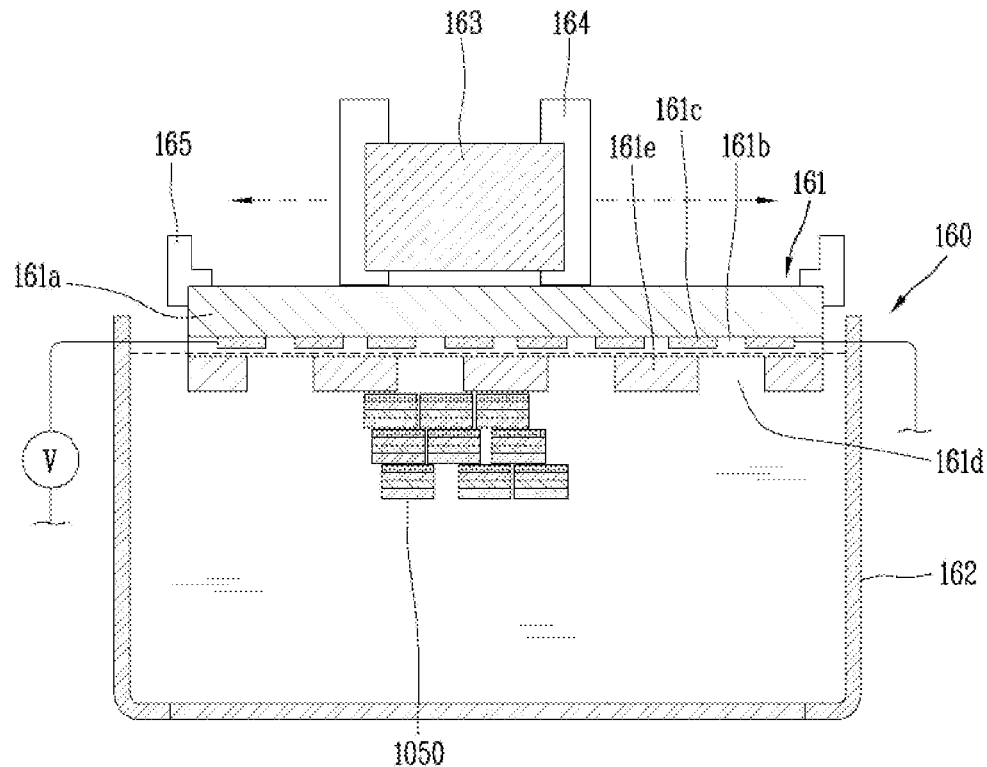
[FIG. 8d]
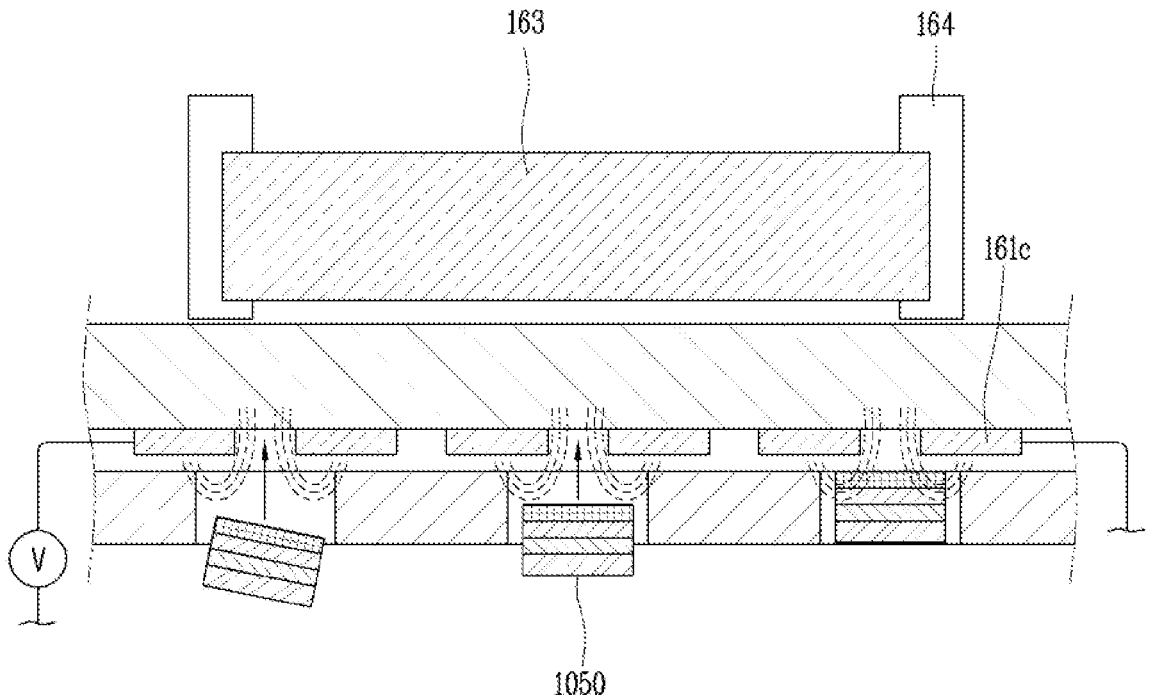

[FIG. 8e]
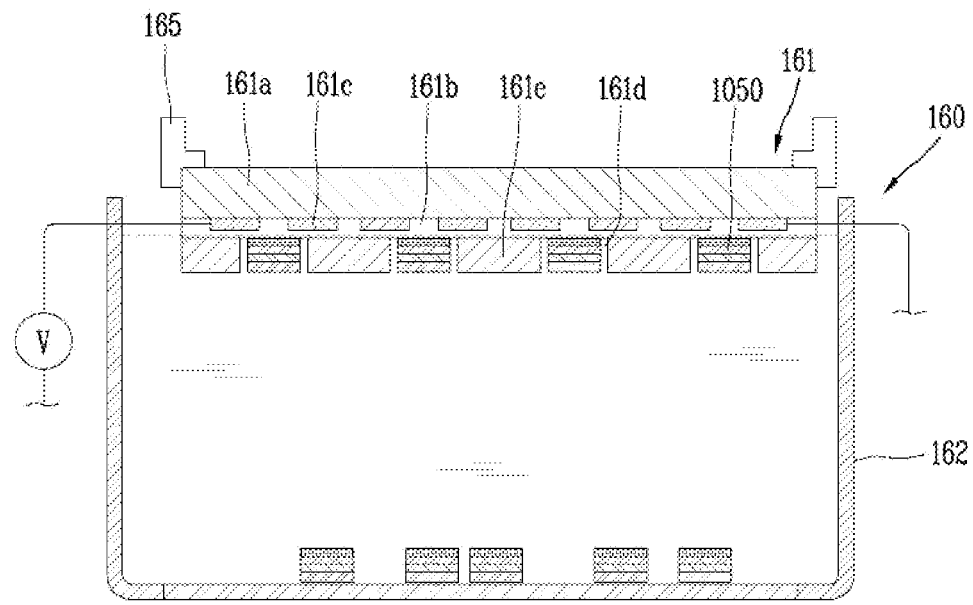
[FIG. 9]
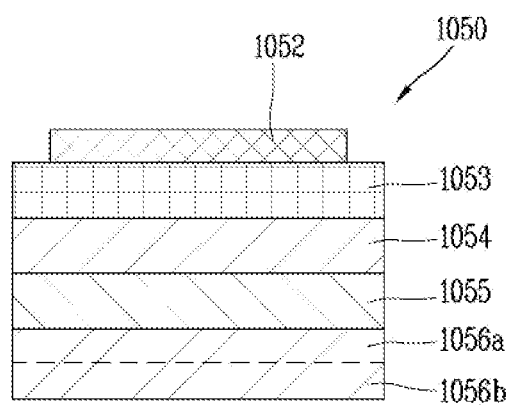

[FIG. 10]
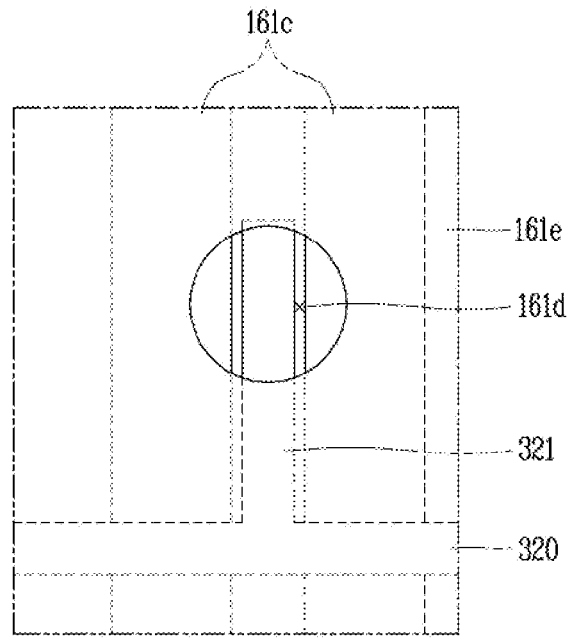
[FIG. 11]
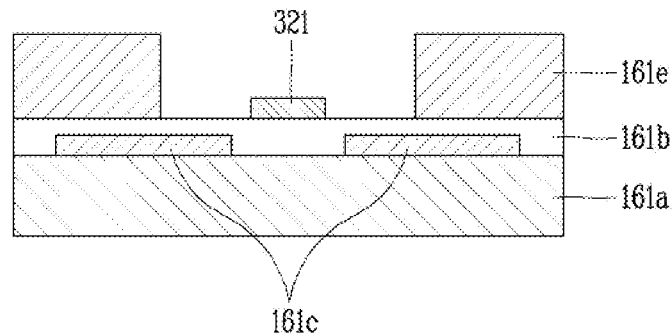
[FIG. 12]
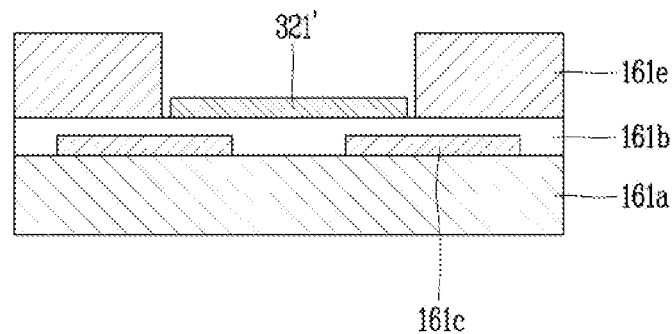

[FIG. 13]
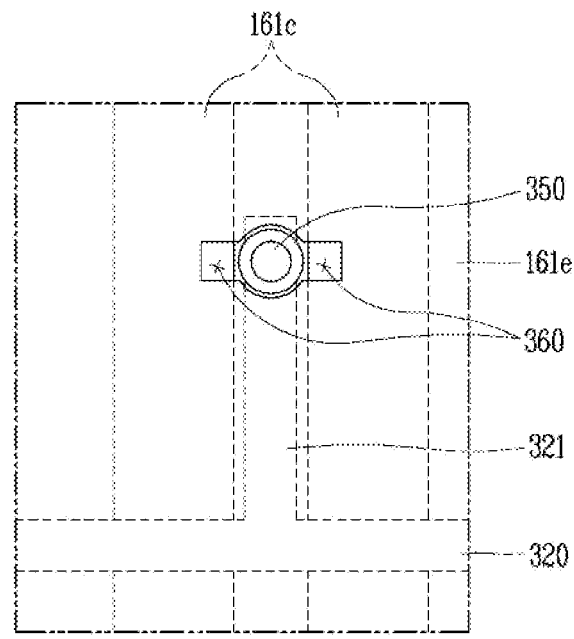
[FIG. 14]
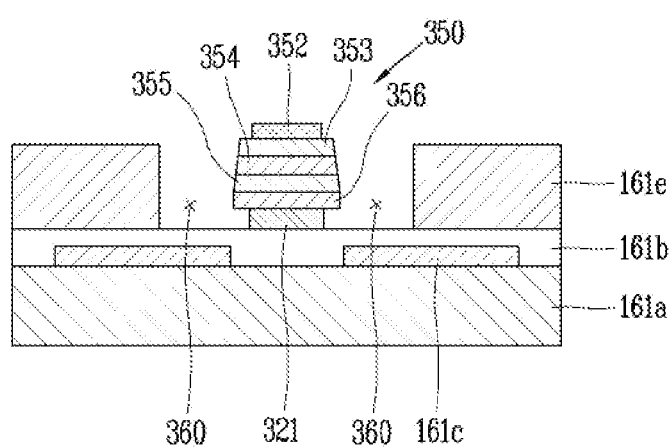

[FIG. 15]
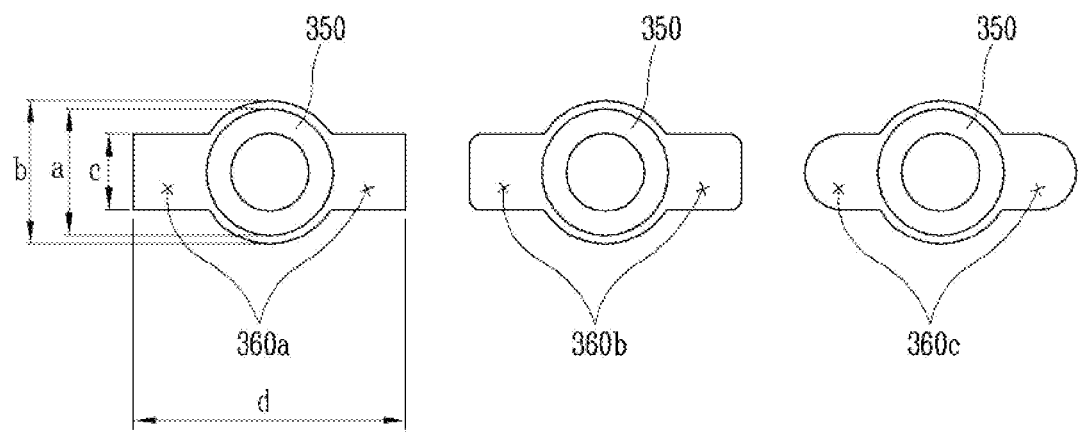

[FIG. 16]
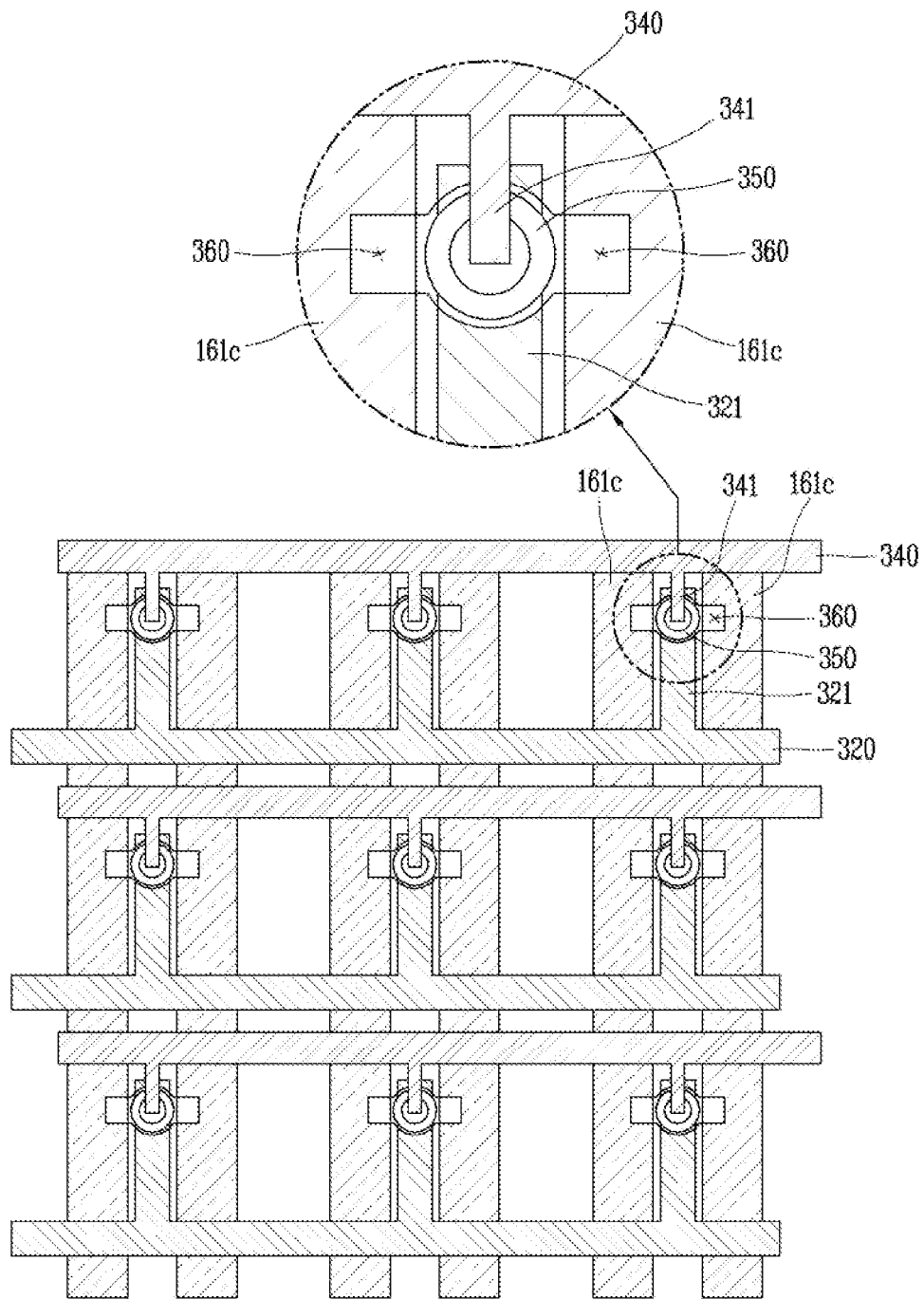

DISPLAY APPARATUS USING SEMICONDUCTOR LIGHT-EMITTING DEVICE

CROSS-REFERENCE TO RELATED APPLICATIONS

This application is the National Stage filing under 35 U.S.C. 371 of International Application No. PCT/KR2020/001937, filed on Feb. 12, 2020, which claims the benefit of earlier filing date and right of priority to Korean Application No. 10-2020-0008867, filed on Jan. 22, 2020, the contents of which are all incorporated by reference herein in their entirety.

TECHNICAL FIELD

The present invention relates to a display device, and more particularly, to a display device using a semiconductor light emitting device having a size of several μm to several tens of μm.

BACKGROUND ART

Recently, liquid crystal displays (LCD), organic light emitting diode (OLED) displays, and micro LED displays are competing to implement a large-area display in the field of display technology.

On the other hand, when a semiconductor light emitting device (micro LED: uLED)) having a diameter or cross-sectional area of 100 microns or less is used for a display, very high efficiency can be provided because the display does not absorb light using a polarizing plate or the like. However, since a large display requires millions of semiconductor light emitting devices, it is difficult to transfer the devices compared to other technologies.

The technology currently being developed as a transfer process includes a pick & place method, a laser lift-off (LLO) method, or a self-assembly method. Among them, the self-assembly method is a method in which the semiconductor light emitting device finds its own position in a fluid, and is the most advantageous method for realizing a large-screen display device.

Recently, although a micro LED structure suitable for self-assembly has been proposed in U.S. Pat. No. 9,825,202, research on a technology for manufacturing a display through self-assembly of the micro LED is still insufficient. Accordingly, the present invention proposes a new type of manufacturing method and manufacturing apparatus in which the micro LED can be self-assembled.

DISCLOSURE

Technical Problem

One object of the present invention is to provide a new manufacturing process having high reliability in a large-screen display using a micro-sized semiconductor light emitting device.

Another object of the present invention is to provide a manufacturing process capable of improving transfer precision when self-assembling a semiconductor light emitting device as an assembly substrate.

Another object of the present invention is to provide a structure capable of securing a high transfer yield even when the size of a semiconductor light emitting device is reduced.

Technical Solution

In order to achieve the above object, a display device according to the present invention includes a base part, a partition wall having a plurality of grooves, a plurality of semiconductor light emitting devices disposed on the base part and seated in the plurality of grooves, and first and second wiring electrodes respectively disposed on one side and the other side of the light emitting devices. It may also include an assembly electrode disposed on the base part and disposed on one side of the semiconductor light emitting devices, and a dielectric layer disposed on the base part and disposed between the assembly electrode and the first wiring electrode. Each of the plurality of grooves may include at least one recess portion formed in a horizontal direction with respect to the base part.

In an embodiment, at least a partial region of the recess portion may be formed to overlap the assembly electrode.

In an embodiment, the assembly electrode may include first and second electrodes disposed with one semiconductor light emitting device therebetween, and the recess portion may be formed to overlap each of the first and second electrodes.

In an embodiment, the recess portion formed in each of the plurality of grooves can include a first recess in which at least a partial region is formed to overlap the first electrode, and a second recess in which at least a partial region is formed to overlap the second electrode.

In an embodiment, the first and second recesses may be formed in a direction crossing the extending direction of the first and second electrodes.

In an embodiment, the first wiring electrode may be disposed between the first and second electrodes, and the width of the first wiring electrode may be smaller than the interval between the first and second electrodes.

In an embodiment, a portion of the bottom surface of the groove may not overlap the first wiring electrode and the first and second electrodes.

In an embodiment, a width of the recess portion may be smaller than a maximum width of the semiconductor light emitting device.

In an embodiment, the present invention may further include a planarization layer formed to fill the groove and the recess portion.

In an embodiment, the planarization layer may be made of the same material as the partition wall.

Advantageous Effects

According to the present invention having the above configuration, in a display device in which individual pixels are formed of micro light emitting diodes, a large number of semiconductor light emitting devices can be assembled at once.

As described above, according to the present invention, it is possible to convert a semiconductor light emitting device into a large amount of pixels on a small-sized wafer and then transfer it to a large-area substrate. Through this, it is possible to manufacture a large-area display device at a low cost.

In addition, according to the manufacturing method of the present invention, it is possible to simultaneously transfer a semiconductor light emitting device to a position by using a magnetic field and an electric field in a solution. Accordingly, it is possible to realize low-cost, high-efficiency, and high-speed transfer regardless of the size, number, or transfer area of parts.

Furthermore, since it is assembled by an electric field, selective assembly is possible through selective electrical application without a separate additional device or process. In addition, by arranging the assembly substrate on the upper side of the chamber, loading and unloading of the substrate can be facilitated. Since loading and unloading can be facilitated, non-specific binding of the semiconductor light emitting device can be prevented.

Further, according to the present invention, even if the wiring electrode disposed under the semiconductor light emitting device shields the electric field during self-assembly, the strength of the electric field formed in the recess portion formed in the assembly substrate can be increased. Accordingly, it is possible to perform self-assembly with a high yield. Therefore, it is possible to secure a high yield even when the vertical type semiconductor light emitting device is used for self-assembly.

DESCRIPTION OF DRAWINGS

FIG. 1 is a conceptual diagram illustrating an embodiment of a display device using a semiconductor light emitting device of the present invention.

FIG. 2 is a partially enlarged view of a portion A of the display device of FIG. 1.

FIG. 3 is an enlarged view of the semiconductor light emitting device of FIG. 2.

FIG. 4 is an enlarged view illustrating another embodiment of the semiconductor light emitting device of FIG. 2.

FIG. 5A to 5E are conceptual views for explaining a new process of manufacturing the above-described semiconductor light emitting device.

FIG. 6 is a conceptual diagram illustrating an example of an apparatus for self-assembly of a semiconductor light emitting device according to the present invention.

FIG. 7 is a block diagram of the self-assembly apparatus of FIG. 6.

FIGS. 8A to 8E are conceptual views illustrating a process of self-assembling a semiconductor light emitting device using the self-assembly apparatus of FIG. 6.

FIG. 9 is a conceptual diagram illustrating the semiconductor light emitting device of FIGS. 8A to 8E.

FIG. 10 is a plan view of an assembly substrate used for self-assembly of a vertical type semiconductor light emitting device.

FIG. 11 is a cross-sectional view of an assembly substrate used for self-assembly of a vertical type semiconductor light emitting device.

FIG. 12 is a conceptual diagram illustrating an embodiment in which a lower wiring is formed too wide.

FIG. 13 is a conceptual view of a state in which a semiconductor light emitting device is assembled on an assembly substrate according to the present invention as viewed from above.

FIG. 14 is a cross-sectional view illustrating a state in which a semiconductor light emitting device is assembled on an assembly substrate according to the present invention.

FIG. 15 is a conceptual diagram illustrating various embodiments of a recess portion included in a display device according to the present invention.

FIG. 16 is a plan view of a display device according to the present invention.

MODE FOR INVENTION

Hereinafter, the embodiments disclosed in the present specification will be described in detail with reference to the accompanying drawings, but the same or similar components are assigned the same reference numbers regardless of reference numerals, and redundant description thereof will be omitted. The suffixes "module" and "part" for components used in the following description are given or mixed in consideration of only the ease of writing the specification, and do not have distinct meanings or roles by themselves. In addition, in describing the embodiments disclosed in the present specification, if it is determined that detailed descriptions of related known technologies may obscure the gist of the embodiments disclosed in this specification, the detailed description thereof will be omitted. In addition, it should be noted that the accompanying drawings are only for easy understanding of the embodiments disclosed in the present specification, and should not be construed as limiting the technical spirit disclosed in the present specification by the accompanying drawings.

It is also understood that when an element, such as a layer, region, or substrate, is referred to as being "on" another component, it may be directly present on the other element or intervening elements in between. There will be.

The display device described in this specification includes a mobile phone, a smart phone, a laptop computer, a digital broadcasting terminal, a personal digital assistant (PDA), a portable multimedia player (PMP), a navigation system, and a slate PC, Tablet PCs, Ultra Books, Digital TVs, Digital Signage, Head Mounted Displays (HMDs), desktop computers, and the like. However, it will be readily apparent to those skilled in the art that the configuration according to the embodiment described in the present specification may be applied to a display capable device even in a new product form to be developed later.

FIG. 1 is a conceptual diagram illustrating an embodiment of a display device using a semiconductor light emitting device of the present invention, FIG. 2 is a partial enlarged view of part A of the display device of FIG. 1, and FIG. 3 is an enlarged view of the semiconductor light emitting device of FIG. 2 and FIG. 4 is an enlarged view showing another embodiment of the semiconductor light emitting device of FIG. 2.

As illustrated, information processed by the control unit of the display apparatus 100 may be output from the display module 140. A closed-loop case 101 surrounding an edge of the display module may form a bezel of the display device.

The display module 140 includes a panel 141 on which an image is displayed, and the panel 141 includes a micro-sized semiconductor light emitting device 150 and a wiring board 110 on which the semiconductor light emitting device 150 is mounted.

A wiring may be formed on the wiring board 110 to be connected to the n-type electrode 152 and the p-type electrode 156 of the semiconductor light emitting device 150. Through this, the semiconductor light emitting device 150 may be provided on the wiring board 110 as an individual pixel that emits light.

The image displayed on the panel 141 is visual information, and is realized by independently controlling light emission of sub-pixels arranged in a matrix form through the wiring.

In the present invention, a micro LED (Light Emitting Diode) is exemplified as a type of the semiconductor light emitting device 150 that converts current into light. The micro LED may be a light emitting diode formed in a small size of 100 micrometers or less. In the semiconductor light emitting device 150, blue, red, and green colors are provided in the light emitting region, respectively, and a unit pixel may be realized by a combination thereof. That is, the unit pixel means a minimum unit for realizing one color, and at least three micro LEDs may be provided in the unit pixel.

More specifically, referring to FIG. 3, the semiconductor light emitting device 150 may have a vertical structure.

For example, the semiconductor light emitting device 150 is mainly made of gallium nitride (GaN), and indium (In) and/or aluminum (Al) are added together to be implemented as a high output light emitting device that emits various lights including blue.

The vertical type semiconductor light emitting device includes a p-type electrode 156, a p-type semiconductor layer 155 formed on the p-type electrode 156, an active layer 154 formed on the p-type semiconductor layer 155, and an active layer 154. It includes an n-type semiconductor layer 153 formed thereon, and an n-type electrode 152 formed on the n-type semiconductor layer 153. In this case, the lower p-type electrode 156 may be electrically connected to the p-electrode of the wiring board, and the upper n-type electrode 152 may be electrically connected to the n-electrode at the upper side of the semiconductor light emitting device. The vertical type semiconductor light emitting device 150 has a great advantage in that it is possible to reduce the chip size because electrodes can be arranged up and down.

As another example, referring to FIG. 4, the semiconductor light emitting device may be a flip chip type light emitting device.

As an example, the semiconductor light emitting device 250 includes a p-type electrode 256, a p-type semiconductor layer 255 on which the p-type electrode 256 is formed, and an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and the n-electrode of the wiring board under the semiconductor light emitting device.

The vertical type semiconductor light emitting device and the horizontal semiconductor light emitting device may be a green semiconductor light emitting device, a blue semiconductor light emitting device, or a red semiconductor light emitting device, respectively. In the case of a green semiconductor light emitting device and a blue semiconductor light emitting device, gallium nitride (GaN) is mainly used, and indium (In) and/or aluminum (Al) are added together to implement a high output light emitting device that emits green or blue light. For this example, the semiconductor light emitting device may be a gallium nitride thin film formed in various layers such as n-Gan, p-Gan, AlGaN, InGan, etc. Specifically, the p-type semiconductor layer is P-type GaN, and the n-type semiconductor layer may be N-type GaN. However, in the case of a red semiconductor light emitting device, the p-type semiconductor layer may be P-type GaAs, and the n-type semiconductor layer may be N-type GaAs.

Also, the p-type semiconductor layer may be P-type GaN doped with Mg on the p-electrode side, and the n-type semiconductor layer may be N-type GaN doped with Si on the n-electrode side. In this case, the above-described semiconductor light emitting devices may be semiconductor light emitting devices without an active layer.

Meanwhile, referring to FIGS. 1 to 4, since the light emitting diodes are very small, unit pixels that emit self-luminescence can be arranged in a high definition in the display panel, thereby realizing a high-definition display device.

In the display device using the semiconductor light emitting device of the present invention described above, the semiconductor light emitting device grown on a wafer and formed through mesa and isolation is used as an individual pixel. In this case, the micro-sized semiconductor light emitting device 150 is to be transferred to a predetermined position on the substrate of the display panel on the wafer. There is a pick and place method as such a transfer technology, but the success rate is low and a lot of time is required. As another example, there is a technique of transferring several devices at once using a stamp or a roll, but there is a limit to the yield, so it is not suitable for a large screen display. The present invention proposes a new manufacturing method and manufacturing apparatus of a display device that can solve these problems.

To this end, a new method of manufacturing a display device will be first described below. FIGS. 5A to 5E are conceptual views for explaining a new process of manufacturing the above-described semiconductor light emitting device.

In the present specification, a display device using a passive matrix (PM) type semiconductor light emitting device is exemplified. However, the examples described below are also applicable to an active matrix (AM) type semiconductor light emitting device. In addition, although a method of self-assembling a horizontal semiconductor light emitting device is exemplified, it is also applicable to a method of self-assembling a vertical type semiconductor light emitting device.

First, according to the manufacturing method, the first conductivity type semiconductor layer 153, the active layer 154, and the second conductivity type semiconductor layer 155 are grown on the growth substrate 159, respectively (refer to FIG. 5A).

After the first conductivity type semiconductor layer 153 is grown, an active layer 154 is grown on the first conductivity type semiconductor layer 153, and then a second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5A, the first conductivity type semiconductor layer 153, the active layer 154 and the second conductive semiconductor layer 155 form a stacked structure.

In this case, the first conductivity-type semiconductor layer 153 may be a p-type semiconductor layer, and the second conductivity-type semiconductor layer 155 may be an n-type semiconductor layer. However, the present invention is not necessarily limited thereto, and examples in which the first conductivity type is n-type and the second conductivity type is p-type are also possible.

In addition, although the case in which the active layer is present is exemplified in this embodiment, a structure without the active layer is possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. It can be formed of a material having excellent thermal conductivity. And it includes a conductive substrate or an insulating substrate. For example, it includes at least one of a SiC substrate or Si, GaAs, GaP, InP, Ga2O3 which has higher thermal conductivity than a sapphire (Al2O3) substrate.

Next, at least some of the first conductivity type semiconductor layer 153, the active layer 154, and the second conductivity type semiconductor layer 155 are removed to form a plurality of semiconductor light emitting devices (refer FIG. 5B).

More specifically, isolation is performed so that the plurality of light emitting devices form a light emitting device array. That is, the first conductivity type semiconductor layer 153, the active layer 154, and the second conductivity type semiconductor layer 155 are vertically etched to form a plurality of semiconductor light emitting devices.

In the case of forming a horizontal type semiconductor light emitting device, the active layer 154 and the second conductivity type semiconductor layer 155 are partially removed in the vertical direction so that the first conductivity type semiconductor layer 153 is exposed to the outside. An exposed mesa process, followed by an isolation of the first conductive semiconductor layer to form a plurality of semiconductor light emitting device arrays by etching may be performed.

Next, second conductive electrodes 156 (or p-type electrodes) are respectively formed on one surface of the second conductivity type semiconductor layer 155 (refer to FIG. 5C). The second conductive electrode 156 may be formed by a deposition method such as sputtering, but the present invention is not limited thereto. However, when the first conductive semiconductor layer and the second conductive semiconductor layer are an n-type semiconductor layer and a p-type semiconductor layer, respectively, the second conductive electrode 156 may be an n-type electrode.

After then, the growth substrate 159 is removed to provide a plurality of semiconductor light emitting devices. For example, the growth substrate 159 may be removed using a laser lift-off (LLO) method or a chemical lift-off (CLO) method (refer to FIG. 5D).

Thereafter, a step of mounting the semiconductor light emitting devices 150 on a substrate in a chamber filled with a fluid is performed (refer to FIG. 5E).

For example, the semiconductor light emitting devices 150 and the substrate are put in a chamber filled with a fluid, and the semiconductor light emitting devices are self-assembled on the substrate 161 using flow, gravity, surface tension, and the like. In this case, the substrate may be the assembly substrate 161.

As another example, it is also possible to put a wiring board in a fluid chamber instead of the assembly board 161 so that the semiconductor light emitting devices 150 are directly seated on the wiring board. In this case, the substrate may be a wiring substrate. However, for convenience of explanation, in the present invention, the substrate is provided as the assembly substrate 161 to exemplify that the semiconductor light emitting devices 1050 are seated.

Cells (not shown) in which the semiconductor light emitting devices 150 are inserted may be provided on the assembly substrate 161 to facilitate mounting of the semiconductor light emitting devices 150 on the assembly substrate 161. Specifically, cells in which the semiconductor light emitting devices 150 are seated are formed on the assembly substrate 161 at positions where the semiconductor light emitting devices 150 are aligned with the wiring electrodes. The semiconductor light emitting devices 150 are assembled to the cells while moving in the fluid.

After a plurality of semiconductor light emitting devices are arrayed on the assembly board 161, if the semiconductor light emitting devices of the assembly board 161 are transferred to a wiring board, large-area transfer is possible. Accordingly, the assembly substrate 161 may be referred to as a temporary substrate.

On the other hand, in order to apply the self-assembly method described above to the manufacture of a large-screen display, it is necessary to increase the transfer yield. The present invention proposes a method and apparatus for minimizing the influence of gravity or frictional force and preventing non-specific binding in order to increase the transfer yield.

In this case, in the display device according to the present invention, a magnetic material is disposed on the semiconductor light emitting device to move the semiconductor light emitting device using magnetic force, and the semiconductor light emitting device is seated at a predetermined position by using an electric field during the movement process. Hereinafter, such a transfer method and apparatus will be described in more detail with the accompanying drawings.

FIG. 6 is a conceptual diagram illustrating an example of a self-assembly apparatus for a semiconductor light emitting device according to the present invention, and FIG. 7 is a block diagram of the self-assembly apparatus of FIG. 6. FIGS. 8A to 8E are conceptual views illustrating a process of self-assembling a semiconductor light emitting device using the self-assembly apparatus of FIG. 6, and FIG. 9 is a conceptual diagram illustrating the semiconductor light emitting device of FIGS. 8A to 8E.

According to FIGS. 6 and 7, the self-assembly apparatus 160 of the present invention may include a fluid chamber 162, a magnet 163 and a position control unit 164.

The fluid chamber 162 has a space for accommodating a plurality of semiconductor light emitting devices. The space may be filled with a fluid, and the fluid may include water as an assembly solution. Accordingly, the fluid chamber 162 may be a water tank and may be configured as an open type. However, the present invention is not limited thereto, and the fluid chamber 162 may be of a closed type in which the space is a closed space.

The substrate 161 may be disposed in the fluid chamber 162 so that an assembly surface on which the semiconductor light emitting devices 150 are assembled faces downward. For example, the substrate 161 may be transferred to an assembly position by a transfer unit, and the transfer unit may include a stage 165 on which the substrate is mounted. The position of the stage 165 is adjusted by the controller, and through this, the substrate 161 can be transferred to the assembly position.

At this time, in the assembly position, the assembly surface of the substrate 161 faces the bottom of the fluid chamber 150. As shown, the assembly surface of the substrate 161 is disposed to be immersed in the fluid in the fluid chamber 162. Accordingly, the semiconductor light emitting device 150 moves to the assembly surface in the fluid.

The substrate 161 is an assembled substrate capable of forming an electric field, and may include a base part 161a, a dielectric layer 161b, and a plurality of electrodes 161c.

The base part 161a may be made of an insulating material, and the plurality of electrodes 161c may be a thin film or a thick film bi-planar electrode patterned on one surface of the base part 161a. The electrode 161c may be formed of, for example, a stack of Ti/Cu/Ti, Ag paste, ITO, or the like.

The dielectric layer 161b is made of an inorganic material such as SiO2, SiNx, SiON, Al2O3, TiO2, HfO2, or the like. Alternatively, the dielectric layer 161b may be configured as a single layer or multi-layer as an organic insulator. The dielectric layer 161b may have a thickness of several tens of nm to several μm.

Furthermore, the substrate 161 according to the present invention includes a plurality of cells 161d partitioned by partition walls. The cells 161d are sequentially arranged in one direction and may be made of a polymer material. Also, the partition walls 161e forming the cells 161d are shared with the neighboring cells 161d. The partition wall 161e protrudes from the base part 161a, and the cells 161d may be sequentially disposed along one direction by the partition wall 161e. More specifically, the cells 161d are sequentially arranged in the column and row directions, respectively, and may have a matrix structure.

Inside the cells 161d, as shown, a groove for accommodating the semiconductor light emitting device 150 is provided, and the groove may be a space defined by the partition wall 161e. The shape of the groove may be the same as or similar to that of the semiconductor light emitting device. For example, when the semiconductor light emitting device has a rectangular shape, the groove may have a rectangular shape. Also, although not shown, when the semiconductor light emitting device has a circular shape, the grooves formed in the cells may have a circular shape. Furthermore, each of the cells is configured to accommodate a single semiconductor light emitting device. That is, one semiconductor light emitting device is accommodated in one cell.

Meanwhile, the plurality of electrodes 161c may include a plurality of electrode lines disposed at the bottom of each of the cells 161d, and the plurality of electrode lines may extend to neighboring cells.

The plurality of electrodes 161c are disposed below the cells 161d, and different polarities are applied to each other to generate an electric field in the cells 161d. To form the electric field, the dielectric layer may form the bottom of the cells 161d while covering the plurality of electrodes 161c with the dielectric layer. In this structure, when different polarities are applied to the pair of electrodes 161c under each of the cells 161d, an electric field is formed, and the semiconductor light emitting device can be inserted into the cells 161d by the electric field.

In the assembly position, the electrodes of the substrate 161 are electrically connected to the power supply unit 171. The power supply unit 171 applies power to the plurality of electrodes to generate the electric field.

As illustrated, the self-assembly apparatus may include a magnet 163 for applying a magnetic force to the semiconductor light emitting devices. The magnet 163 is spaced apart from the fluid chamber 162 to apply a magnetic force to the semiconductor light emitting devices 150. The magnet 163 may be disposed to face the opposite surface of the assembly surface of the substrate 161, and the position of the magnet is controlled by the position controller 164 connected to the magnet 163.

The semiconductor light emitting device 1050 may include a magnetic material to move in the fluid by the magnetic field of the magnet 163.

Referring to FIG. 9, the semiconductor light emitting device includes a magnetic material. The semiconductor light emitting device may include a first conductive electrode 1052, a second conductive electrode 1056, and a first conductivity type semiconductor layer 1053 disposed on the first conductive electrode 1052. The semiconductor light emitting device includes a second conductivity type semiconductor layer 1055 overlapping the first conductivity type semiconductor layer 1052 and disposed on the second conductive electrode 1056 and the first and second conductivity type semiconductors and an active layer 1054 disposed between the layers 1053 and 1055.

Here, the first conductivity type may be p-type, the second conductivity type may be n-type, and vice versa. In addition, as described above, the semiconductor light emitting device without the active layer may be used.

Meanwhile, in the present invention, the first conductive electrode 1052 may be generated after the semiconductor light emitting device is assembled on the wiring board by self-assembly of the semiconductor light emitting device. Also, in the present invention, the second conductive electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided on the second conductive electrode 1056 in the form of particles. Alternatively, in a conductive electrode including a magnetic material, one layer of the conductive electrode may be formed of a magnetic material. For this example, as shown in FIG. 9, the second conductive electrode 1056 of the semiconductor light emitting device 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductive semiconductor layer 1055. In this case, the first layer 1056a is disposed between the second layer 1056b and the second conductivity type semiconductor layer 1055. The second layer 1056b may be a contact metal connected to the second electrode of the wiring board. However, the present invention is not necessarily limited thereto, and the magnetic material may be disposed on one surface of the first conductivity type semiconductor layer.

Referring back to FIGS. 6 and 7, more specifically, the self-assembly device includes a magnet handler that can be moved automatically or manually in the x, y, and z axes on the upper portion of the fluid chamber, or the magnet 163. It may be provided with a motor capable of rotating the. The magnet handler and the motor may constitute the position control unit 164. Through this, the magnet 163 rotates in a horizontal direction, clockwise or counterclockwise direction with the substrate 161.

Meanwhile, a light-transmitting bottom plate 166 may be formed in the fluid chamber 162, and the semiconductor light emitting devices may be disposed between the bottom plate 166 and the substrate 161. An image sensor 167 may be disposed to face the bottom plate 166 to monitor the inside of the fluid chamber 162 through the bottom plate 166. The image sensor 167 is controlled by the controller 172 and may include an inverted type lens and a CCD to observe the assembly surface of the substrate 161.

The self-assembly apparatus described above is made to use a combination of a magnetic field and an electric field, and using these, the semiconductor light emitting devices are seated at a predetermined position on the substrate by an electric field in the process of moving by a change in the position of the magnet. Hereinafter, the assembly process using the self-assembly apparatus described above will be described in more detail.

First, a plurality of semiconductor light emitting devices 1050 including a magnetic material are formed through the process described with reference to FIGS. 5A to 5C. In this case, in the process of forming the second conductive type electrode of FIG. 5C, a magnetic material may be deposited on the semiconductor light emitting device.

Next, the substrate 161 is transferred to an assembly position, and the semiconductor light emitting devices 1050 are put into the fluid chamber 162 (refer to FIG. 8A).

As described above, the assembly position of the substrate 161 will be a position in which the fluid chamber 162 is disposed such that the assembly surface of the substrate 161 on which the semiconductor light emitting devices 1050 are assembled faces downward.

In this case, some of the semiconductor light emitting devices 1050 may sink to the bottom of the fluid chamber 162 and some may float in the fluid. A light-transmitting bottom plate 166 is provided in the fluid chamber 162, and some of the semiconductor light emitting devices 1050 may sink to the bottom plate 166.

Next, a magnetic force is applied to the semiconductor light emitting devices 1050 so that the semiconductor light emitting devices 1050 vertically float in the fluid chamber 162 (refer to FIG. 8B).

When the magnet 163 of the self-assembly device moves from its original position to the opposite surface of the assembly surface of the substrate 161, the semiconductor light emitting devices 1050 float toward the substrate 161 in the fluid. The original position may be a position deviated from the fluid chamber 162. As another example, the magnet 163 may be configured as an electromagnet. In this case, electricity is supplied to the electromagnet to generate an initial magnetic force.

Meanwhile, in this example, when the magnitude of the magnetic force is adjusted, the spaced distance between the assembly surface of the substrate 161 and the semiconductor light emitting devices 1050 may be controlled. For example, the spaced distance is controlled using the weight, buoyancy, and magnetic force of the semiconductor light emitting devices 1050. The spaced distance may be several millimeters to several tens of micrometers from the outermost surface of the substrate.

Next, a magnetic force is applied to the semiconductor light emitting devices 1050 so that the semiconductor light emitting devices 1050 move in one direction in the fluid chamber 162. For example, the magnet 163 moves in a direction horizontal to the substrate, clockwise or counterclockwise (refer to FIG. 8C). In this case, the semiconductor light emitting devices 1050 move in a direction parallel to the substrate 161 at a position spaced apart from the substrate 161 by the magnetic force.

Next, in the process of moving the semiconductor light emitting devices 1050, applying an electric field to guide the semiconductor light emitting devices 1050 to the preset position so that they are seated at a preset position of the substrate 161 proceed (FIG. 8c). For example, while the semiconductor light emitting devices 1050 are moving in a direction horizontal to the substrate 161, they are moved in a direction perpendicular to the substrate 161 by the electric field, so that the installed in the set position.

More specifically, an electric field is generated by supplying power to the bi-planar electrode of the substrate 161, and assembly is induced only at a preset position using this. That is, by using the selectively generated electric field, the semiconductor light emitting devices 1050 are self-assembled at the assembly position of the substrate 161. To this end, cells in which the semiconductor light emitting devices 1050 are inserted may be provided on the substrate 161.

Thereafter, the unloading process of the substrate 161 is performed, and the assembly process is completed. When the substrate 161 is an assembly substrate, a post-process for realizing a display device by transferring the semiconductor light emitting devices arranged as described above to a wiring board may be performed.

On the other hand, after guiding the semiconductor light emitting devices 1050 to the predetermined position, the magnet so that the semiconductor light emitting devices 1050 remaining in the fluid chamber 162 fall to the bottom of the fluid chamber 162. The magnet 163 may be moved in a direction away from the substrate 161 (refer to FIG. 8D). As another example, when power supply is stopped when the magnet 163 is an electromagnet, the semiconductor light emitting devices 1050 remaining in the fluid chamber 162 fall to the bottom of the fluid chamber 162.

Thereafter, when the semiconductor light emitting devices 1050 at the bottom of the fluid chamber 162 are recovered, the recovered semiconductor light emitting devices 1050 can be reused.

The self-assembly apparatus and method described above uses a electric field to concentrate distant parts near a predetermined assembly site to increase the assembly yield in fluidic assembly, and applies a separate electric field to the assembly site so that the parts are selectively transferred only to the assembly site to be assembled. At this time, the assembly board is placed on the upper part of the water tank and the assembly surface is directed downward to minimize the effect of gravity due to the weight of the parts and prevent non-specific binding to eliminate defects. That is, to increase the transfer yield, the assembly substrate is placed on the upper part to minimize the effect of gravity or frictional force, and to prevent non-specific binding.

As described above, according to the present invention having the above configuration, in a display device in which individual pixels are formed of semiconductor light emitting devices, a large number of semiconductor light emitting devices can be assembled at once.

As described above, according to the present invention, it is possible to pixelate a semiconductor light emitting device in a large amount on a small-sized wafer and then transfer it to a large-area substrate. Through this, it is possible to manufacture a large-area display device at a low cost.

Meanwhile, the size of the semiconductor light emitting device constituting the display device is gradually decreasing. In order to realize a high-definition display device, it is necessary to increase the number of pixels included in a limited area. To this end, the size of the semiconductor light emitting device should be reduced.

On the other hand, as the size of the semiconductor light emitting device becomes smaller, the vertical type semiconductor light emitting device is preferred over the flip chip semiconductor light emitting device. This is because the vertical type semiconductor light emitting device has a larger light emitting area compared to the flip chip semiconductor light emitting device. As the size of the semiconductor light emitting device becomes smaller, the light emitting area compared to the chip size is very important.

The present invention relates to a self-assembled display device using a vertical type semiconductor light emitting device. First, a basic structure of a self-assembled display device using a vertical type semiconductor light emitting device will be described.

FIG. 10 is a plan view of an assembly substrate used for self-assembly of a vertical type semiconductor light emitting device, FIG. 11 is a cross-sectional view of an assembly substrate used for self-assembly of a vertical type semiconductor light emitting device, and FIG. 12 is a conceptual diagram illustrating an embodiment in which a lower wiring is formed too wide.

The structure of the assembly substrate for self-assembly of the vertical type semiconductor light emitting device is almost similar to the assembly substrate described with reference to FIGS. 8A to 8E. Hereinafter, unless otherwise specified, the term 'assembly substrate' refers to an assembly substrate for self-assembly of vertical type semiconductor light emitting devices. Referring to FIGS. 10 and 11, the assembly substrate used for self-assembly of the vertical type semiconductor light emitting device includes a base part 161*a*, a dielectric layer 161*b*, an assembly electrode 161*c*, a groove 161*d*, and a partition wall portion 161*e*.

Meanwhile, the assembly substrate includes a wiring electrode 320 for applying power to the conductive electrode disposed below the vertical type semiconductor light emitting device. In this specification, the lower wiring electrode is referred to as a first wiring electrode 320. Also, the first wiring electrode 320 may include a protrusion 321 for facilitating electrical connection to the semiconductor light emitting device. The first wiring electrode 320 and the protrusion 321 are formed on the dielectric layer 161*b*. Accordingly, the dielectric layer 161*b* is disposed between the assembly electrode 161*c* and the first wiring electrode 320, and is disposed between the assembly electrode 161*c* and the protrusion 321. Due to the dielectric layer 161*b*, the assembly electrode 161*c* and the first wiring electrode 320 maintain an insulating state from each other.

Meanwhile, the assembly electrode 161*c* includes first and second electrodes disposed with a semiconductor light emitting device therebetween. During self-assembly, an electric field is formed between the first and second electrodes to seat the semiconductor light emitting device in the groove 161*d*. In this case, the first wiring electrode 320 and the protrusion 321 serve as a shielding layer to shield an electric field formed between the assembled electrodes 161*c* during self-assembly.

For this reason, the area of the first wiring electrode overlapping the groove 161*d* in which the semiconductor light emitting devices are mounted should be minimized. In addition, it is preferable that a portion of the first wiring electrode overlapping the groove 161*d* does not overlap the assembly electrode 161*e*.

In an embodiment, when the first wiring electrode 320 is electrically connected to the semiconductor light emitting device through the protrusion 321, the protrusion 321 is disposed between the first and second electrodes, and each of the first and of the second electrodes may be disposed so as not to overlap each other. To this end, the width of the protrusion 321 should be smaller than the distance between the first and second electrodes.

On the other hand, in order to improve the self-assembly yield, it is preferable that a portion of the first and second electrodes are disposed to overlap the groove. Through this, the magnitude of the electric field formed inside the groove may be maximized.

On the other hand, as shown in FIG. 12, when the first wiring electrode 320 or the protrusion 321' provided in the first wiring electrode 320 is formed too wide, the electric field formed inside the groove can be excessively shielded to that the assembly itself can be difficult.

As the size of the semiconductor light emitting device decreases, the size of the groove also decreases. Accordingly, the distance between the first and second electrodes is also reduced, and the width of the protrusion 321 is to be also very small. For example, when a semiconductor light emitting device having a size of 10 µm is used for self-assembly, the line width of the protrusion 321 should be within several µm. However, it is very difficult to form the wiring electrode with the above-described width in the process, and even if the protrusion 321 having a width of several µm is formed, it overlaps with a large portion of the groove so that most of the electric field formed inside the groove can be shielded.

For the above reasons, as the size of the vertical type semiconductor light emitting device decreases, it becomes more difficult to form the lower wiring of the semiconductor light emitting device, which inevitably reduces the self-assembly yield. The present invention provides a structure capable of securing a high self-assembly yield when self-assembling a vertical type semiconductor light emitting device having a size of 30 µm or less.

Hereinafter, the structure of the display device according to the present invention will be described in detail.

FIG. 13 is a conceptual diagram of a state in which a semiconductor light emitting device is assembled on an assembly board according to the present invention as viewed from above, and FIG. 14 is a cross-sectional view of a state in which a semiconductor light emitting device is assembled on an assembly board according to the present invention.

Referring to FIGS. 13 and 14, the display device according to the present invention includes a base part 161*a*, a plurality of light emitting devices 350, first and second wiring electrodes 320 and 340, an assembly electrode 161*c*, and a dielectric layer. 161*b* and a partition wall portion 161*e* are provided. Hereinafter, the above-described components will be described in detail. However, the present invention is not limited thereto, and the display device according to the present invention may include more or fewer components than the above-described components.

Since the base part 161*a* is the same as the base part 161*a* described with reference to FIGS. 8A to 8E, a detailed description thereof will be omitted.

Meanwhile, the plurality of semiconductor light emitting devices 350 may be vertical type semiconductor light emitting devices. However, the shape of the semiconductor light emitting device 350 according to the present invention may be different from the shape of the vertical type semiconductor light emitting device described with reference to FIG. 3.

Specifically, the semiconductor light emitting device 350 according to the present invention mainly uses gallium nitride (GaN), and indium (In) and/or aluminum (Al) are added together to emit various light including blue light.

Such a vertical type semiconductor light emitting device has a first conductive electrode 356, a first conductivity type semiconductor layer 355 formed on the first conductive electrode 356, and an active layer 354 formed on the first conductivity type semiconductor layer 355, a second conductivity type semiconductor layer 353 formed on the active layer 354, and a second conductive electrode 352 formed on the second conductivity type semiconductor layer 353.

In order to apply an external power to the first conductive electrode 356, at least one wiring electrode should be disposed under the semiconductor light emitting device. The wiring electrode will be described later.

Meanwhile, the semiconductor light emitting device 350 may have a symmetrical structure. In an embodiment, the semiconductor light emitting device may have a cylindrical shape. However, the present invention is not limited thereto, and the semiconductor light emitting device may have an asymmetric shape with respect to a specific axis. In the present specification, a cylindrical vertical type semiconductor light emitting device is described as an example, but the shape of the semiconductor light emitting device is not limited to a cylindrical shape.

At least one wiring electrode is disposed on the upper and lower sides of the semiconductor light emitting device 350. In this specification, the lower side of the semiconductor light emitting device 350 means a direction toward the assembly substrate with respect to the semiconductor light emitting device 350, and the upper side of the semiconductor light emitting device 350 means a direction opposite to the lower side.

Hereinafter, a wiring electrode (hereinafter, referred to as a first wiring electrode) disposed below the semiconductor light emitting device 350 will be described. The first wiring electrode 320 is disposed below the semiconductor light emitting device, and the first wiring electrode 320 is electrically connected to the semiconductor light emitting device 350 or a protrusion 321 protruding from the first wiring electrode 320 may be electrically connected to the semiconductor light emitting device 350. In this specification, an exemplary embodiment in which the protrusion 321 is electrically connected to the semiconductor light emitting device 350 will be described, but the present disclosure is not limited thereto.

The protrusion 321 is formed to extend between the assembly electrodes 161c and is formed so as not to overlap the assembly electrodes 161c. In addition, a region that does not overlap with both the assembly electrode 161c and the protrusion 321 exists on the bottom surface of the groove formed in the partition wall portion 161e, which will be described later.

Meanwhile, the assembly electrode 161c includes first and second electrodes disposed with the semiconductor light emitting device 350 interposed therebetween. During self-assembly, an electric field is formed between the first and second electrodes to seat the semiconductor light emitting device 350 in the groove.

Since the dielectric layer 161b is formed to cover the assembly electrode 161c, and the first wiring electrode 320 is formed on the dielectric layer, the assembly electrode 161c and the first wiring electrode 320 are not electrically connected.

Meanwhile, a portion (for example, a portion of the protrusion 321) formed inside the groove among the entire area of the first wiring electrode 320 is not covered with the insulating material. This is to electrically connect the first wiring electrode 320 and the semiconductor light emitting device 350 without a separate electrode connection process during self-assembly.

Next, the partition wall 161e is described. The assembly substrate according to the present invention includes a plurality of cells 161d partitioned by a partition wall 161e. The cells 161d are sequentially arranged in one direction and may be made of a polymer material. Also, the partition walls 161e forming the cells 161d are shared with the neighboring cells 161d. The partition wall 161e protrudes from the base part 161a, and the cells 161d may be sequentially disposed along one direction by the partition wall 161e. More specifically, the cells 161d are sequentially arranged in the column and row directions, respectively, and may have a matrix structure.

Inside the cells 161d, as shown, a groove for accommodating the semiconductor light emitting device 350 is provided, and the groove may be a space defined by the partition wall 161e. At least one recess portion 360 may be formed in the groove.

The recess portion 360 is formed in a horizontal direction with respect to the base part 161a and becomes a part of the groove. The semiconductor light emitting device 350 is not seated in the recess portion 360, and the recess portion 360 is formed around the semiconductor light emitting device 350.

Specifically, at least a partial region of the recess portion 360 is formed to overlap the assembly electrode 161c. In one embodiment, the recess portion 360 is formed in a direction crossing the extending direction of the assembly electrode 161c and includes the first recess overlapping the first electrode, and the second recess overlapping the second electrode. The first and second recesses may be formed in both directions with respect to the semiconductor light emitting device 350.

The recess portion 360 serves to increase the strength of the electric field formed inside the groove by exposing the assembly electrode 161c to the outside as much as possible during self-assembly. The recess portion 360 prevents the first wiring electrode 320 from acting as a shielding layer, thereby preventing a decrease in the strength of the electric field formed inside the groove during self-assembly. For this reason, it is preferable that the recess portion 360 maximizes the exposed area of the assembled electrode 161c during self-assembly. However, even if a portion of the assembly electrode 161c is not covered by the partition wall 161e by the recess portion 360, a portion of the assembly electrode 161c is covered with the dielectric layer 161b. This is to prevent the assembly electrode 161c from being oxidized as the assembly electrode 161c is exposed to a fluid during self-assembly.

Meanwhile, the recess portion 360 may be formed in various shapes.

FIG. 15 is a conceptual diagram illustrating various embodiments of a recess portion included in a display device according to the present invention.

In one embodiment, referring to FIG. 15, when the cylindrical semiconductor light emitting device 350 is used for self-assembly, the groove is formed in a circular shape, and the recess portion 360a is formed in two on both sides of the circular groove. The diameter (b) of the groove should be larger than the diameter (a) of the semiconductor light emitting device. For example, the diameter (b) of the groove is preferably 5 to 30% larger than the diameter (a) of the semiconductor light emitting device 350.

Meanwhile, the width c of the recess portion 360a is to be smaller than the diameter a of the semiconductor light emitting device. When the width c of the recess portion 360a is excessively small, the amount of change in the intensity of the electric field caused by the recess portion 360a may be insignificant. On the other hand, when the width c of the recessed portion 360a is excessively large, the semiconductor light emitting device 350 may be incorrectly assembled in the recessed portion 360a. Accordingly, the width c of the recess portion 360a is preferably 25 to 75% of the diameter of the semiconductor light emitting device 350.

Meanwhile, the maximum length d of the groove including the recess portion 360a is preferably 1.5 times or more of the diameter a of the semiconductor light emitting device. When the width c of the recess portion 360a is sufficiently narrowed, the possibility that the semiconductor light emitting device 350 is incorrectly assembled is lowered, so the maximum length d of the groove including the recess portion 360a is preferable to be formed long enough.

On the other hand, the recess portion is not necessarily formed in a rectangular shape. In one embodiment, referring to the second and third drawings of FIG. 15, the distal ends of the recesses 360b and 360c may be formed to include curved surfaces.

After self-assembly, a planarization layer may be formed on the assembly substrate on which the semiconductor light emitting device is mounted. The planarization layer may be a resin having light transmittance, and the resin is also filled in a space between the semiconductor light emitting device 350 and the groove. When the resin is the same material as the material constituting the partition wall portion 161e, the partition wall and the planarization layer may not be visually distinguished after the planarization layer is formed. Meanwhile, the planarization layer is also formed inside the recess portion 360. After the planarization layer is formed, an upper wiring (hereinafter, referred to as a second wiring electrode) is formed on the semiconductor light emitting device 350.

FIG. 16 is a plan view of a display device according to the present invention.

Referring to FIG. 16, after the planarization layer is formed, a second wiring electrode 340 may be formed on the planarization layer. A protrusion 341 may be formed in the second wiring electrode 340, and the protrusion 341 electrically connects the second wiring electrode 340 and the semiconductor light emitting device 350.

The protrusion 341 may be made of a material different from that of the second wiring electrode 340. In an embodiment, the second wiring electrode 340 may be made of a metal material, and the protrusion 341 may be made of a transparent electrode such as indium tin oxide (ITO).

Although not shown, if necessary, the second wiring electrode 340 and the protrusion 341 protruding from the second wiring electrode 340 may be formed to overlap the recessed portion 360. Since the recess portion 360 is filled with a light-transmitting material, other structures may be formed on the recess portion 360.

As described above, according to the present invention, even if the wiring electrode disposed under the semiconductor light emitting device shields the electric field during self-assembly, the recess portion formed in the assembly substrate increases the strength of the electric field formed inside the groove, so the high yield self-assembly can be performed. Accordingly, it is possible to secure a high yield even when the vertical type semiconductor light emitting device is used for self-assembly.

What is claimed is:

1. A display device comprising:
a base;
partition walls defining a plurality of grooves;
a plurality of semiconductor light emitting devices disposed on the base part and seated in the plurality of grooves;
wherein for each of the plurality of grooves, the display device comprises:
first and second wiring electrodes respectively disposed at opposite ends of each of the semiconductor light emitting devices;
an assembly electrode disposed on the base along a first direction adjacent to the semiconductor light emitting devices;
a dielectric layer disposed on the base and disposed between the assembly electrode and the corresponding first wiring electrode; and
at least one recess portion formed in the groove, wherein the at least one recess portion comprises a first recess portion and a second recess portion extended from both sides of each of the plurality of grooves along a second direction perpendicular to the first direction,
wherein a diameter of each of the plurality of grooves is greater than that of each of the plurality of semiconductor light emitting devices, and a width of each of the first recess portion and the second recess portion is less than the diameter of the plurality of semiconductor light emitting devices.

2. The display device according to claim 1, wherein the assembly electrode comprises first and second assembly electrodes disposed opposite each other with respect to the semiconductor light emitting devices, and
wherein each of the first recess portion and the second recess portion is configured to overlap each of the first and second assembly electrodes.

3. The display device according to claim 1, wherein the first wiring electrode is disposed between the first and second assembly electrodes.

4. The display device according to claim 3, wherein a portion of a bottom surface of the groove does not overlap the first wiring electrode and the first and second assembly electrodes.

5. The display device according to claim 1, wherein a width of the at least one recess portion is smaller than a maximum width of the semiconductor light emitting device.

6. A display device comprising:
a base;
partition walls defining a plurality of grooves;
a plurality of semiconductor light emitting devices disposed on the base part and seated in the plurality of grooves;
wherein for each of the plurality of grooves, the display device comprises:
first and second wiring electrodes respectively disposed at opposite ends of each of the semiconductor light emitting devices;
first and second assembly electrodes disposed on the base along a first direction and disposed opposite each other with respect to the semiconductor light emitting devices; and
a dielectric layer disposed on the base and disposed between the first and second assembly electrodes and the corresponding first wiring electrode; and
at least one recess portion formed in the groove, and
wherein the at least one recess portion is formed to overlap each of the first and second assembly electrodes,
wherein the at least one recess portion comprises a first recess portion and a second recess portion extended from both sides of each of the plurality of grooves along a second direction perpendicular to the first direction,
wherein a diameter of each of the plurality of grooves is greater than that of each of the plurality of semiconductor light emitting devices, and a width of each of the first recess portion and the second recess portion is less than the diameter of the plurality of semiconductor light emitting devices.

7. The display device according to claim 6, wherein the first wiring electrode is disposed between the first and second assembly electrodes.

8. The display device according to claim 7, wherein a portion of a bottom surface of the groove does not overlap the first wiring electrode and the first and second assembly electrodes.

9. The display device according to claim 1, wherein each of the at least one recess portion is spaced apart each other along the first direction.

10. The display device according to claim 6, wherein each of the at least one recess portion is spaced apart each other along the first direction.

* * * * *